United States Patent
Ryu et al.

(10) Patent No.: US 6,212,121 B1
(45) Date of Patent: Apr. 3, 2001

(54) SEMICONDUCTOR MEMORY DEVICE WITH MULTIPLE SUB-ARRAYS OF DIFFERENT SIZES

(75) Inventors: Hoon Ryu; Moon-Chan Hwang, both of Kyunggi-do; Jun-Young Jeon, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/451,466

(22) Filed: Nov. 30, 1999

(30) Foreign Application Priority Data

Dec. 2, 1998 (KR) ................................................ 98-52629

(51) Int. Cl.$^7$ ...................................................... G11C 8/00
(52) U.S. Cl. ............... 365/230.03; 365/231; 365/230.01; 365/230.06
(58) Field of Search ......................... 365/230.01, 230.03, 365/230.06, 231

(56) References Cited

U.S. PATENT DOCUMENTS

| | | | |
|---|---|---|---|
| 6,041,016 | * | 3/2000 | Freker .............................. 365/230.03 |
| 6,046,923 | * | 4/2000 | Evans ...................................... 365/49 |
| 6,094,382 | * | 7/2000 | Choi et al. ............................ 365/200 |
| 6,098,145 | * | 8/2000 | Huang ...................................... 711/1 |

* cited by examiner

Primary Examiner—Viet Q. Nguyen
(74) Attorney, Agent, or Firm—Skjerven Morrill MacPherson LLP; David Millers (57) ABSTRACT

A semiconductor memory device includes a memory cell array divided into a plurality of sub-arrays. The number of memory cells per bit line in at least one of the sub-arrays differs from the number of memory cells per bit line in other sub-arrays. When the sense amplifiers can accommodate a bit line loading of $(2^M+2^M/N)$ memory cells per bit line, the size and bit line loading of one of more of the sub-arrays can be increased. This can provide sub-arrays of different sizes and can reduce the number of the sub-arrays and the number of the sense amplifier regions. Accordingly, the chip efficiency is improved. Maximum current for sensing during simultaneous accesses of multiple arrays can access two sub-arrays with different bit line loadings and avoid simultaneously accessing two sub-arrays having high bit-line loadings.

8 Claims, 9 Drawing Sheets

SEMICONDUCTOR MEMORY DEVICE WITH MULTIPLE SUB-ARRAYS OF DIFFERENT SIZES

FIELD OF THE INVENTION

The present invention relates to semiconductor memory devices, and more particularly to a semiconductor memory device with sub-arrays of different sizes.

BACKGROUND OF THE INVENTION

Figure 1:
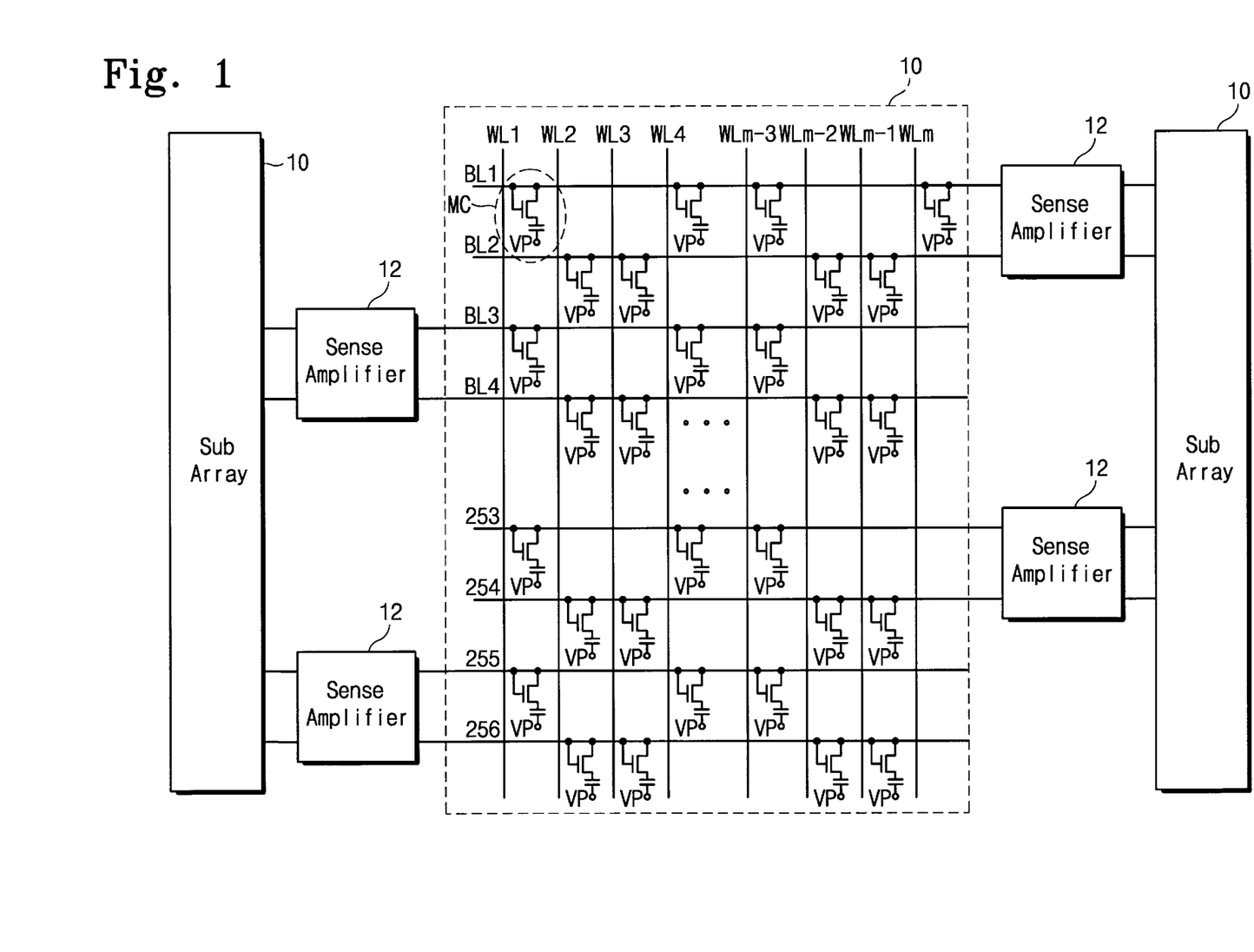
FIG. 1 is a block diagram showing a conventional random access memory device.

In a semiconductor memory device such as a dynamic random access memory (referred to as "DRAM"), a memory cell array typically contains multiple sub-arrays 10 such as illustrated in FIG. 1. Each of the sub-arrays 10 contains multiple word lines WLi (for i equal to 1 to m), multiple bit lines BLj (for j equal to 1 to n), and multiple memory cells MC at intersections of the word lines WLi and the bit lines BLj. Each of the memory cells MC includes a switching transistor (charge transfer transistor) and a capacitor. The gates of the switching transistors couple to corresponding word lines WL1 to WLm, and current paths through the switching transistors are between corresponding bit lines BL1 to BLn and a voltage VP through the corresponding capacitors. Bit lines BL1 to BLn of the respective sub-arrays 10 come in pairs. For example, two adjacent bit lines BLj and BL(j+1) constitute a pair. Multiple sense amplifiers 12, each coupled to pairs of bit lines, are between the sub-arrays 10 and shared by two adjacent sub-arrays 10.

As well known in the art, bit line loading and word line loading increases with the number of memory cells coupled to a word line and a bit line, respectively. Increasing the bit line loading generally increases bit line capacitance and requires improvements in the sensing capability of an attached sense amplifier. Otherwise, the sense amplifier may have difficulty when attempting to sense and amplify a voltage difference between bit lines within a required sensing time. Generally, the sensing capability must match the bit line loading. Accordingly, the sensing ability of the sense amplifiers limits the maximum number of memory cells that can be coupled to a bit line.

Generally, to simplify addressing of the word lines, the number of memory cells on each bit line of each sub-array 10 is a power M of 2 ($2^M$). If the loading per memory cell on the respective bit line is halved, two sub-arrays can be combined into a sub-array having bit lines that are twice as long, and the sense amplifiers can still service the larger sub-array. To achieve the same total memory capacity, a memory with the larger sub-arrays requires fewer sub-arrays and fewer sense amplifier regions between the sub-arrays. Similarly, a two-fold improvement in the sense capability of the sense amplifiers allows doubling of the bit line loading, decreasing the number of sub-arrays 10 by half, and reducing the number of sense amplifiers 12 required for a fixed total memory capacity. However, if the sensing capability of the sense amplifiers or the bit line loading is not improved by at least a factor of two, the number of sense amplifier regions cannot be reduced because conventional addressing requires the subarrays to contain $2^M$ memory cells per bit line. The number of memory cells per bit line cannot be doubled unless sensing capability improves by at least a factor of two. Accordingly, when the sensing capability of the sense amplifiers improves by 1.5 times or the bit line capacitance decreases by 25%, the number of the sub-arrays must be maintained despite the improvement. This means the loss of chip efficiency.

SUMMARY OF THE INVENTION

In accordance with an aspect of the present invention, a semiconductor memory device has sub-arrays where the number of word lines in the sub-array is not a power of two. Accordingly, a reduction in the amount of sensing circuitry can be achieved when the sensing capability of sense amplifiers improves by less than a factor of two.

In one embodiment of the present invention, a semiconductor memory device includes a memory cell array that is divided into a plurality of sub-arrays. Each of the sub-arrays contains a plurality of word lines, a plurality of bit lines, and a plurality of memory cells arranged at intersections of the word lines and the bit lines. Among the sub-arrays, the number of memory cells coupled to the respective bit lines of in at least one sub-array differs from the number of memory cells coupled to the respective bit lines in other sub-arrays.

In accordance with another embodiment, a semiconductor memory device includes a plurality of the sub-arrays and a sub-array selection circuit. Each sub-array comprises a plurality of word lines, a plurality of bit lines and a plurality of memory cells arranged at intersections of the word lines and the bit lines. In at lease one of the sub-arrays, the number of addressable word lines is not a power of two. Accordingly, a row address for the memory does not partition neatly into bits designating a sub-array and bits designating a word line in the sub-array. The selection circuit generates a plurality of selection signals designating which of the sub-arrays are accessed. In response to an address signal corresponding to a word line in the first sub-array, the selection circuit asserts a first of the selection signals to designate access of the first sub-array. In one embodiment, the selection circuit includes a predecoder and a decoder. The predecoder generates one or more set of decoded signals from a received address signal. One set of the decoded signals corresponds to a memory section including $2^M$ word lines for some integer M, and is asserted to indicate the access of a memory cell in the corresponding memory section. One or more address bit or a second set of decoded signals indicates a relative position of the accessed word line within a memory section. The decoder couples to the predecoder and generates the selection signals using the decoded signals alone or with one or more signals indicating bits of the address.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENTS

Hereinafter, the exemplary embodiments of the present invention are described with reference to the accompanying drawings.

Figure 2A:
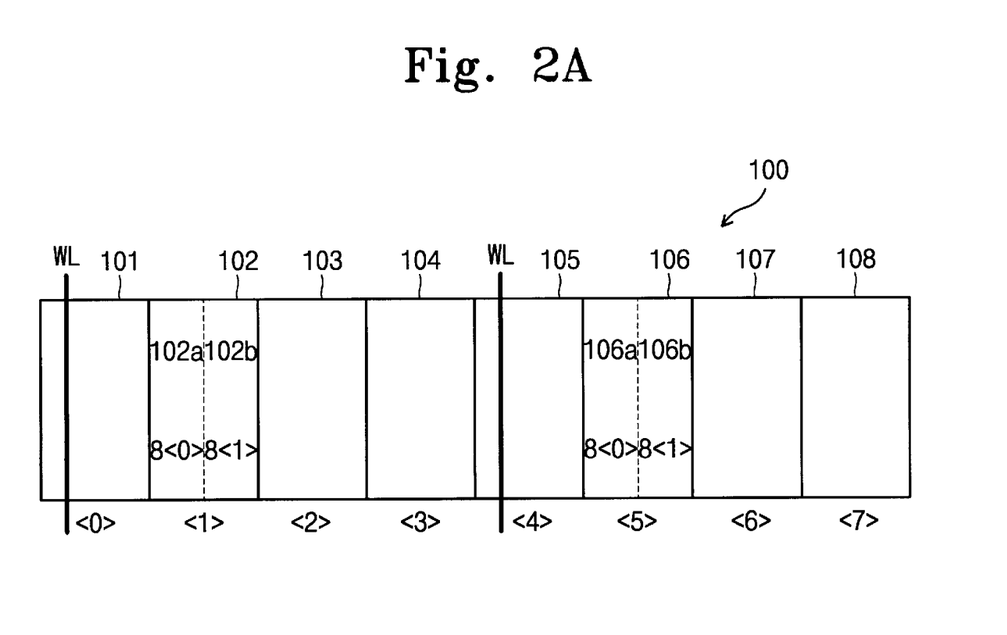
FIGS. 2A and 2B illustrate a sub-array arrangement according to an embodiment of the present invention.
Figure 2B:
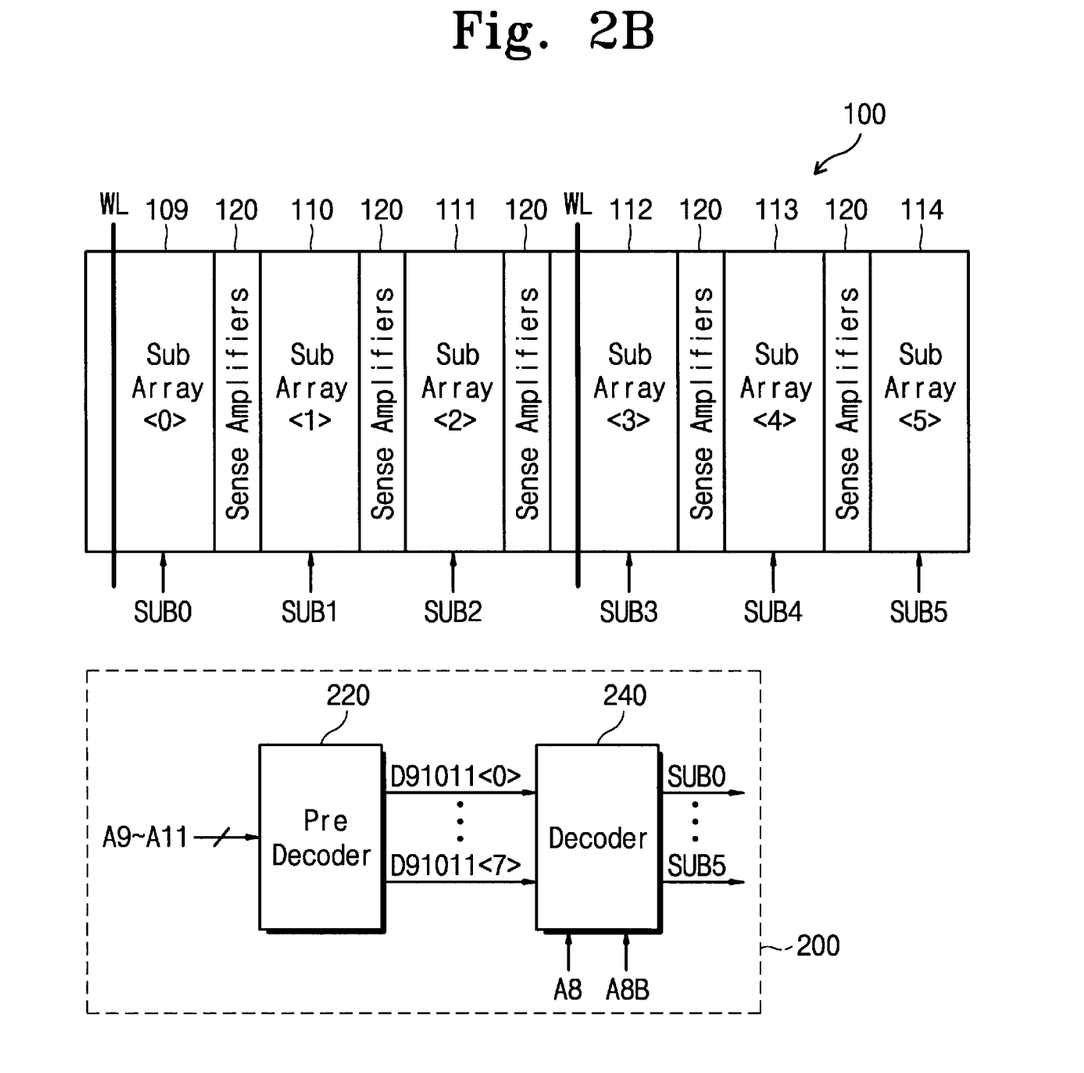

FIGS. 2A and 2B illustrate a sub-array arrangement of a dynamic random access memory device 100 according to an embodiment of the present invention. In FIG. 2A, a memory cell array is divided into eight sections 101 to 108. In each section, the number of word lines is a power M of two. When M is eight, for example, each section 101 to 108 includes 256 word lines, and in a conventional memory configuration, each section would be a sub-array having 256 memory cells coupled to each bit line. According to the present invention, when the sensing capability of sense amplifiers 1.5 times better than needed for $2^M$ memory cells per bit line, the eight sections 101 to 108 are arranged in six sub-arrays 109 to 114 as illustrated in FIG. 2B. The reduction in the number of sub-arrays reduces from eight to six reduces the required number of sense amplifier regions 120 between the sub-arrays.

Each section 101 to 108 includes two to the power M ($2^M$) row lines. However, the sense amplifiers 120 in memory 100 can accommodate 1.5 times as many memory cells per bit line as there are word lines in each section 101 to 108. In particular, each of the sense amplifiers can sense and amplify a voltage difference between corresponding bit lines sufficiently in a fixed sensing period even if the loading of the respective bit lines is increased by 1.5 times over that of sections 101 to 108. (This means that up to $2^M/2$ more memory cells can be connected to the respective bit lines). Accordingly, the eight sections 101 to 108 are rearranged into six sub-arrays 109 to 111 illustrated in FIG. 2B.

In the rearrangement, one of the four sections 101 to 104 is halved across a bit line direction for merger with another section when forming a sub-array. As shown in FIG. 2A, the section 102 is divided into halves 102a and 102b. One half 102a is with the section 101 in the sub-array 109 of FIG. 2B. The other half 102b is with the section 103 in the sub-array 110 of FIG. 2B. At the dividing line in section 102, the bit lines (not shown) ends connect to sense amplifiers 120. Sense amplifiers 120 also break the continuity of bit line between sections 103 and 104. Similarly, rearranging the four sections 105 to 108 forms sub-arrays 112 to 114. With the rearrangement, ($2^M+2^M/2$) memory cells connect to each bit line of the rearranged sub-arrays 109, 110, 112, and 113, and $2^M$ memory cells connect to the bit lines in the sub-arrays 111 and 114.

As seen from the above description, the sub-arrays 109, 110, 112, and 113 have ($2^M+2^M/2$) memory cells per bit line, and the number of memory cells per bit line is not a power of two. The sub-arrays 111 and 114 have $2^M$ (which is a power of 2) memory cells per bit line. Accordingly, the sub-arrays 109, 110, 112, and 114 have a different size from that of the sub-arrays 111 and 114. As the number of the sub-arrays is reduced, the number of sense amplifier regions 120 between adjacent sub-arrays is also reduced. That is, the eight sections 101 to 108 in FIG. 2A, which would be eight sub-arrays in the conventional configuration, are rearranged to the six sub-arrays 109 to 114 in FIG. 2B, eliminating two sense amplifier regions. Accordingly, the chip efficiency is improved.

Continuing to refer to FIGS. 2A and 2B, the dynamic random access memory device further includes a select signal generating circuit 200 that selects one of the six sub-arrays 109 to 114 for memory access operations. The select signal generating circuit 200 generates sub-array select signals SUB0 to SUB5 in response to four address bits A8 to A11. The address bit signals A9 to A11 designate a word line in one of the eight sections 101 to 108, and the address bit signal A8 distinguishes between the left and the right halves of a section. The circuit 200 includes a predecoder 220 and a decoder 240. The predecoder 220 decodes the address bit signals A9 to A11 to generate decoded address signals D91011<0> to D91011<7>. For a memory access, one of signals D91011<0> to D91011<7> is asserted to identify which of sections 101 to 108 contains the selected word line. The symbol D indicates a decoded signal, and the decoded address signals D91011<0> to D91011<7> correspond to the sections 101 to 108, respectively. The decoder 240 generates the sub-array select signals SUB0 to SUB5 corresponding to the six sub-arrays 109 to 114 in response to the decoded address signals D91011<0> to D91011<7> and the address bit signals A8 and A8B. The address bit signal A8 (or A8<0>) is asserted to designate the selected word line is in a left half (e.g., half 102a or 106a) of a section. The address bit signal A8B (or A8<1>) is asserted to designate a right half (e.g., 102b or 106b) of a section.

Figure 3:
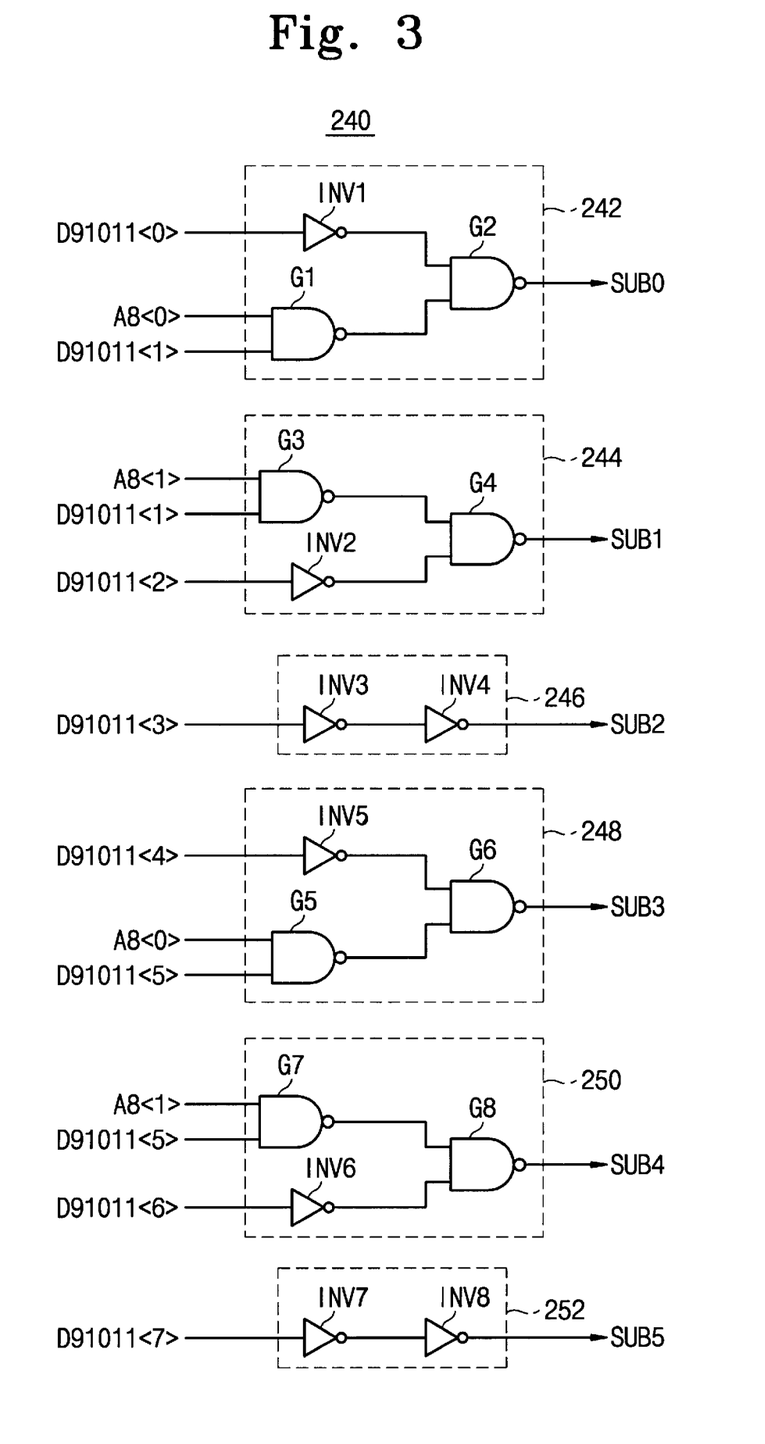
FIG. 3 shows a sub-array select signal generating circuit according to an embodiment of the present invention.

FIG. 3 depicts an embodiment of the decoder 240. In FIG. 3, the decoder 240 includes circuits 242 to 252, which generate the sub-array select signals SUB0 to SUB5, respectively. The circuit 242 for the sub-array select signal SUB0 includes an inverter INV1 and two NAND gates G1 and G2 connected as shown in FIG. 3. The circuit 242 generates the sub-array select signal SUB0 in response to the signal D91011<0> being asserted or signals D91011<1> and A8 (or A8<0>) being asserted. This is because the sub-array 109 includes memory cells corresponding to the section 101 and the left half 102a of section 102. The circuit 244 for the sub-array select signal SUB1 includes an inverter INV2 and two NAND gates G3 and G4 and generates the sub-array select signal SUB1 in response to the signal D91011<2> being asserted or signals D91011<1> and A8B (or A8<1>) being asserted. This is because the sub-array 110 includes memory cells corresponding to the section 103 and the right half 102b of section 102. Since the sub-array 104 is not rearranged, the circuit 246 for generating the sub-array select signal SUB2 includes two serially-connected inverters INV3 and INV4, which serve as a buffer. The circuits 248, 250, and 252 are similar to the circuits 242, 244, and 246, respectively but generate the sub-array select signals SUB3 to SUB5 from signals D9011<4> to D91011<7> instead of signals D9011<0> to D91011<3>.

Accordingly, when the sensing capability of the sense amplifiers is 1.5 times that required for $2^M$ memory cells per bit line, the sub-arrays can be larger. As a result, for a memory array having a fixed storage capacity, the number of the sub-arrays and the number of the sense amplifier regions can be reduced as described above, and the chip efficiency is improved.

Figure 4A:
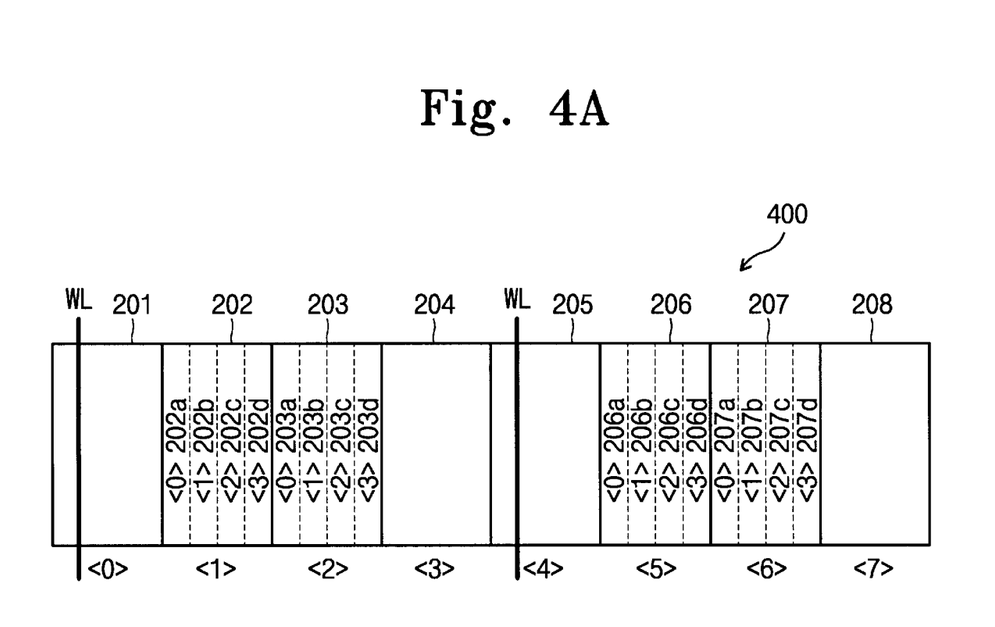
FIGS. 4A and 4B show a sub-array arrangement according to another embodiment of the present invention.
Figure 4B:
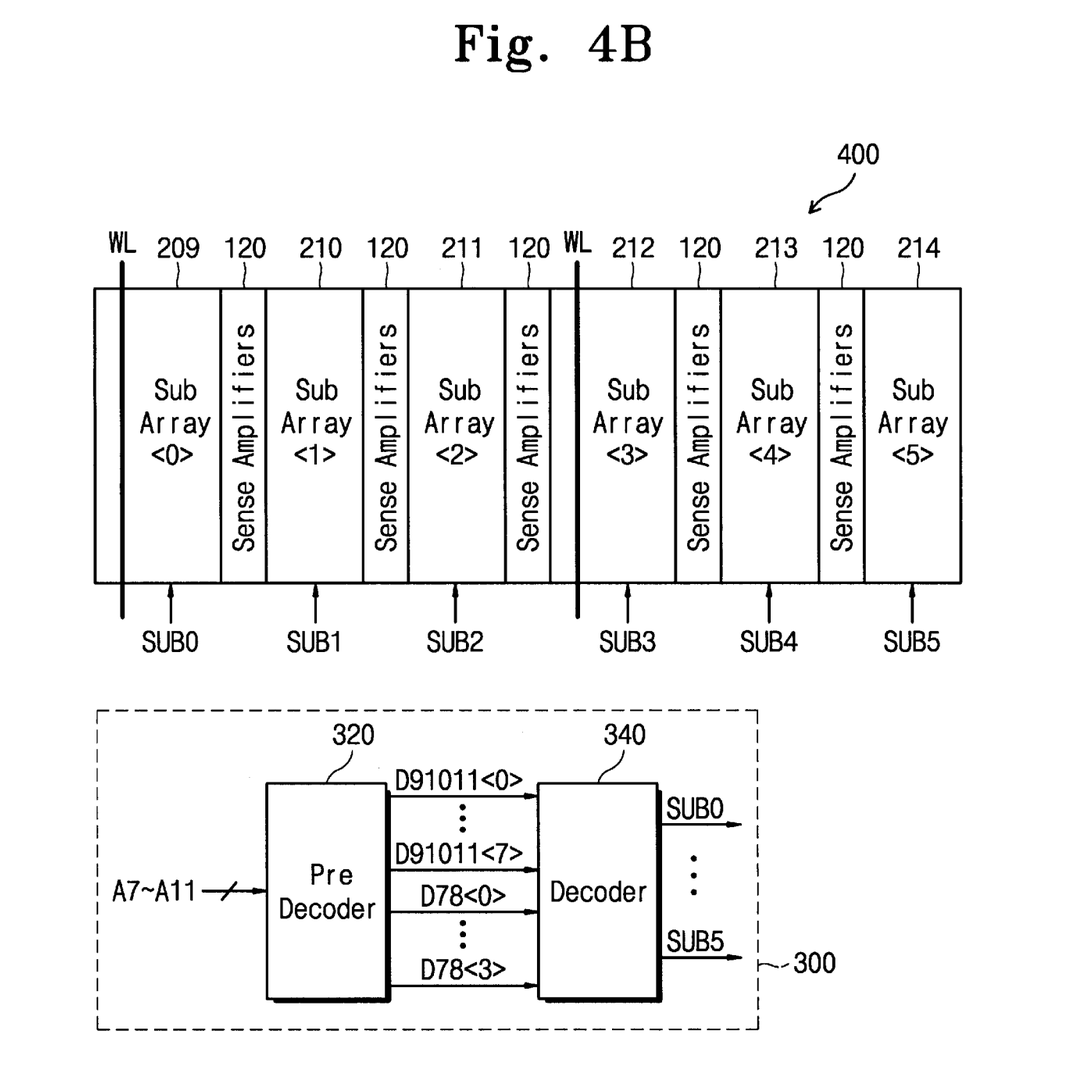

FIGS. 4A and 4B show the sub-array arrangement of a dynamic random access memory device according to a second exemplary embodiment of the present invention. In FIG. 4A, a memory cell array 400 includes eight sections 201 to 208, each of which contains $2^M$ word lines. (For example, when M is 8, each section 201 to 208 contains 256 word lines, and in a conventional configuration, 256 memory cells couple to each bit line). If the sensing capability of sense amplifiers is 1.5 times better than that required for $2^M$ memory cells per bit line, the eight sections 201 to 208 can be rearranged as six sub-arrays 209 to 214 illustrated in FIG. 4B. Accordingly, the memory array 400 of FIG. 4B requires fewer sense amplifier regions 120, which are between adjacent sub-arrays.

For the rearrangement, one of the four sections 201 to 204 is divided into quarters across a bit line direction. In FIG. 4A, the sub-array 202 is divided into four quarter sections 202a to 202d. Two quarter sections 202a and 202b are with the section 201 in the sub-array 209 of FIG. 4B. The remaining quarter sections 202c and 202d are with part of the section 203 in the sub-array 210. In particular, sub-array 203 is divided into quarter sections 203a to 203d. Two quarter 202c and 202d of section 202 are with three quarters 203a, 203b, and 203d of section 203 in the sub-array 210. The remaining quarter 203d of the sub-array 203 is with the sub-array 204 in the sub-array 211. Similarly, the four sections 205 to 208 are rearranged to form three sub-arrays 212 to 214 having the same sizes as sub-arrays 209 to 211, respectively. With the configuration of FIG. 4B, $(2^M+2^M/2)$ memory cells connect the respective bit lines in the sub-arrays 209 and 212, and $(2^M+2^M/4)$ memory cells connect to the respective bit lines in the sub-arrays 210, 211, 213, and 214.

Accordingly, the number of memory cells per bit line of the sub-arrays 209 and 212 is $(2^M+2^M/2)$, not a power of two, and the number of memory cells per bit line of the sub-arrays 210, 211, 213, and 214 is $(2^M+2^M/4)$, not a power of two. With fewer sub-arrays, the number of the sense amplifier regions 120, which are between adjacent sub-arrays, is reduced. Memory array 400 includes six sub-arrays and requires fewer sense amplifier regions than would a memory array which has the eight sub-arrays corresponding to sections 201 to 208. Accordingly, the chip efficiency is improved.

Continuing to refer to FIGS. 4A and 4B, the dynamic random access memory device further comprises a select signal generating circuit 300, which selects one of the six sub-arrays 209 to 214 for memory accesses. The select signal generating circuit 300 generates sub-array select signals SUB0 to SUB5 in response to five row address bits A7 to A11. The address bit signals A9 to A11 designate one of the eight sections 201 to 208, and the address bit signals A7 and A8 designate a particular quarter section. The circuit 300 includes a predecoder 320 and a decoder 340. Predecoder 320 decodes the address bit signals A7 to A11 and generates decoded address signals D91011<0> to D91011<7> and D78<0> to D78<3>. The decoder 340 generates the sub-array select signals SUB0 to SUB5 corresponding to the six sub-arrays 209 to 214 in response to the decoded address signals D91011<0> to D91011<7> and D78<0> to D78<3>. The symbol D indicates a decoded signal, and the decoded address signals D91011<0> to D91011<7> respectively correspond to the sections 201 to 208. The decoded address signals D78<0> to D78<3> respectively correspond to the first to fourth quarters of a section.

Figure 5:
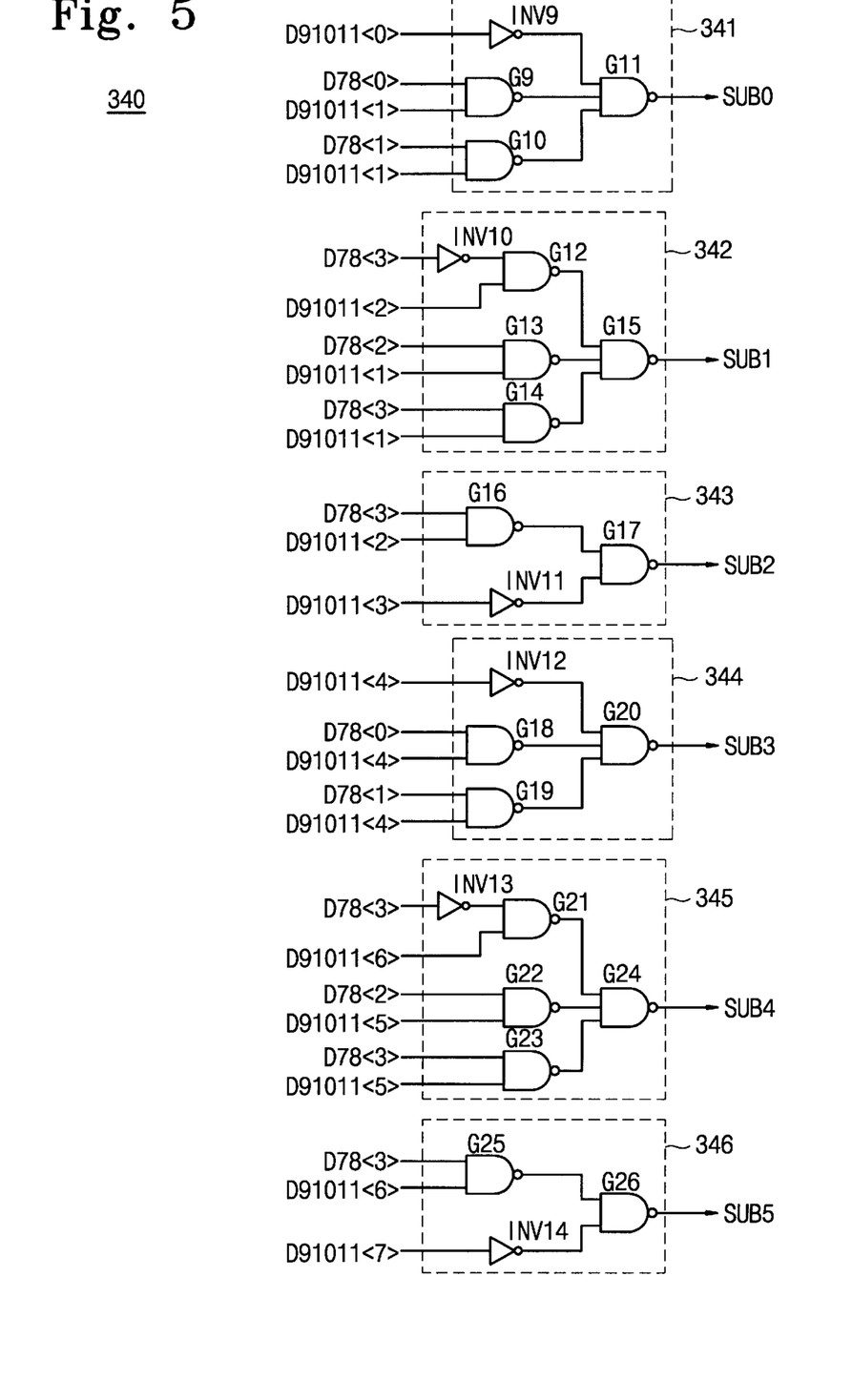
FIG. 5 shows a sub-array select signal generating circuit according to another embodiment of the present invention.

FIG. 5 shows an embodiment of the decoder 340. The decoder 340 includes circuits 341 to 346, which respectively generate the sub-array select signals SUB0 to SUB5. The circuit 341 for the sub-array select signal SUB0 includes an inverter INV9 and three NAND gates G9 to G11 connected as shown in FIG. 5. The circuit 341 asserts the sub-array select signal SUB0 in response to the signals D91011<0> being asserted, D91011<1> and D78<0> being asserted, or D91011<1> and D78<1> being asserted. Thus, select signal generating circuit 300 selects the sub-array 209 if the address signal identifies a word line in section 201 or one of the first two quarter sections 202a and 202b of the section 202.

The circuit 342 for the sub-array select signal SUB1 includes an inverter INV10 and four NAND gates G12 to G15 connected as shown in FIG. 5. The circuit 342 asserts the sub-array select signal SUB1 in response to the signals D91011<1> being asserted while signal D78<2> or D78<3> is asserted, or signal D91011<2> being asserted while D78<3> is not asserted. Thus, select signal generating circuit 300 selects sub-array 210 if the address signal corresponds to a memory cell in the last two quarter sections 202c and 202d of the section 202 or in the first three quarter sections 203a to 203c of the section 203.

The circuit 343 for the sub-array select signal SUB2 includes an inverter INV11 and two NAND gates G16 and G17 connected as illustrated in FIG. 5. The circuit 343 asserts the sub-array select signal SUB2 in response to the signal D91011<3> being asserted or the signals D91011<2> and D78<3> being asserted. Thus select signal generating circuit 300 selects sub-array 211 if the address signal corresponds to a memory cell in the section 204 or the last quarter section 203d of the sub-array 203.

The circuits 344 to 346, which generate the sub-array select signals SUB3 to SUB5, are identical to the circuits 341 to 343 described above but have different input decoded address signals as shown in FIG. 5.

The second exemplary embodiment of the present invention increases the number of memory cells per bit line to $(2^M+2^M/2)$ or $(2^M+2^M/4)$ when the sensing capability of the sense amplifiers is 1.5 times better than required for bit lines connected to $2^M$ memory cells. Further, the smaller number of the sub-arrays reduces the number of required sense amplifier regions 120, so that the chip efficiency is improved.

Figure 6A:
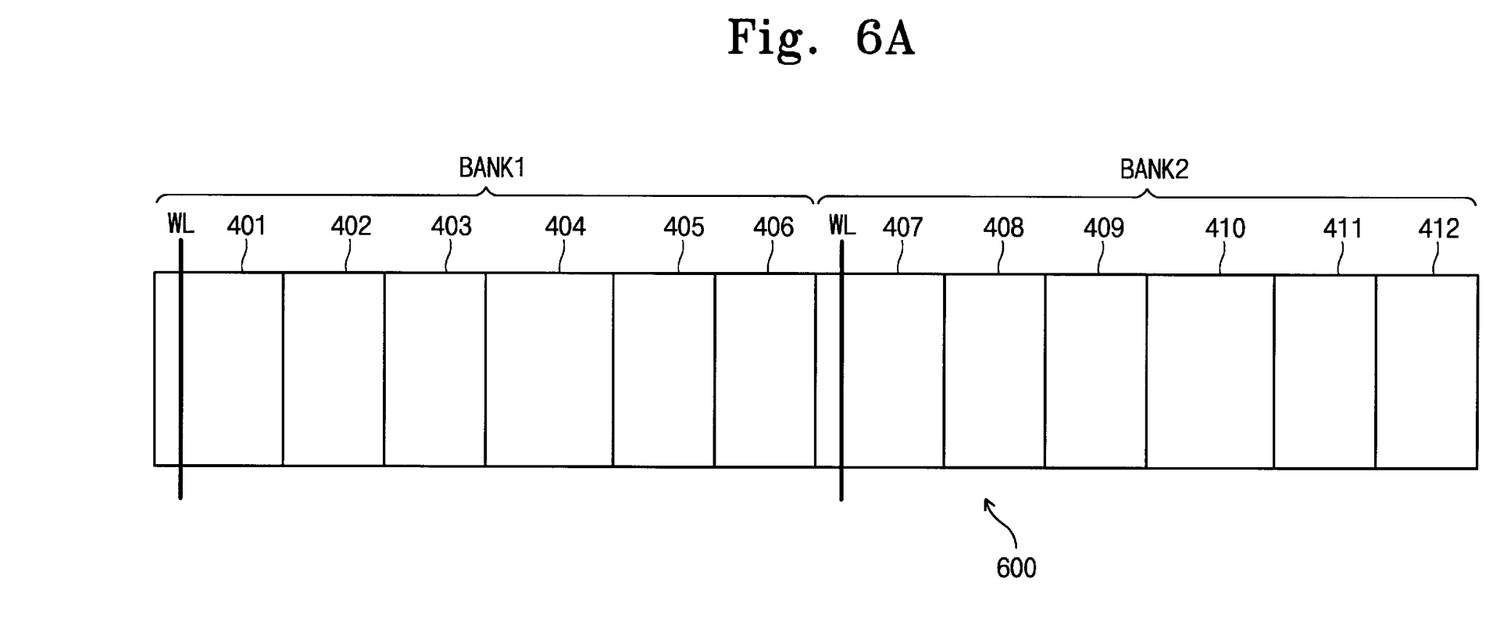
FIGS. 6A and 6B illustrate the sub-array arrangement for minimizing an operating current when two word lines are simultaneously activated.
Figure 6B:
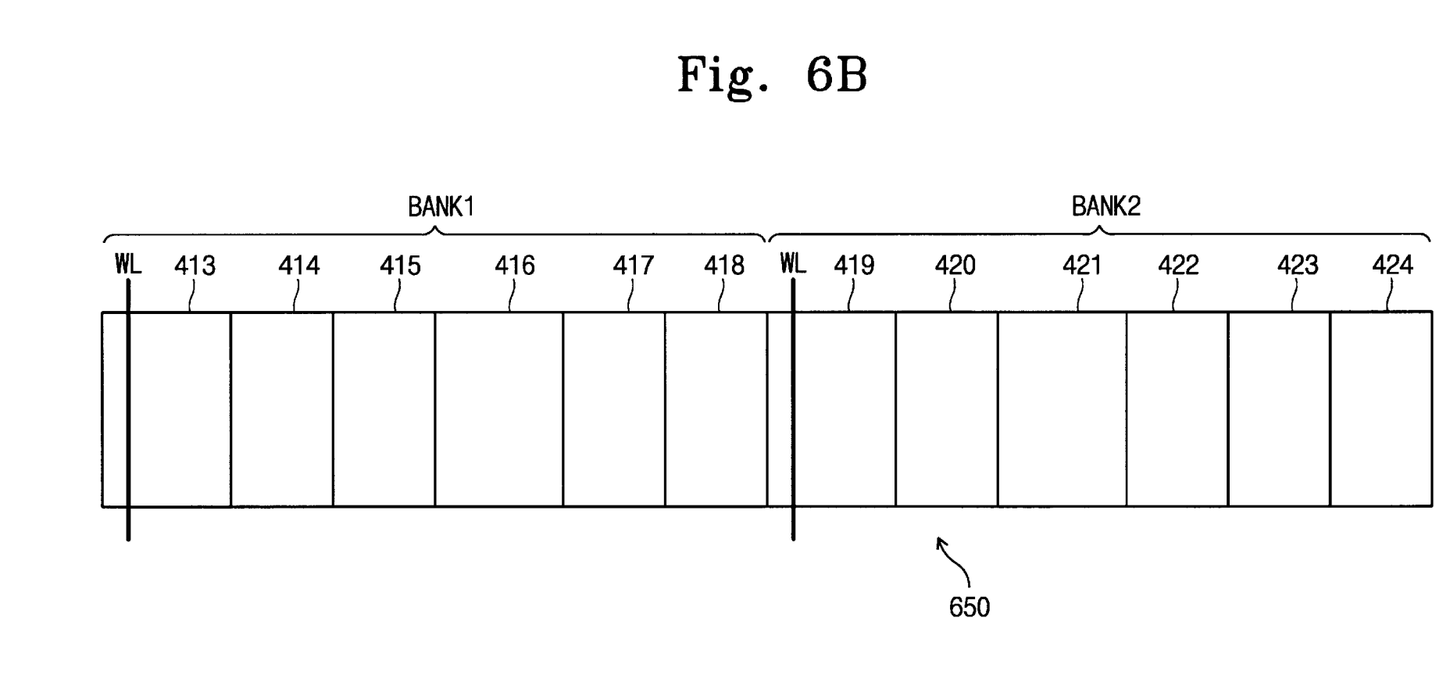

FIGS. 6A and 6B illustrate two possible arrangements of sub-arrays in the banks BANK1 and BANK2. FIG. 6A illustrates an exemplary memory 600, wherein each bank includes six sub-arrays 401 to 406 or 407 to 412 configured in the same manner as the respective sub-arrays 209 to 214 of FIG. 4B. FIG. 6B illustrates an exemplary memory 650 including two banks BANK1 and BANK2, wherein the six sub-arrays 413 to 418 in BANK1 are the same as sub-arrays 209 to 214, respectively, and the six sub-arrays 419 to 424 in BANK2 are the same as sub-arrays 214 to 209, respectively. That is, the first sub-array 413 in bank BANK1 has $(2^M+2^M/2)$ memory cells per bit line, but the first sub-array 419 of bank BANK2 has $(2^M+2^M/4)$ memory cells per bit line. Banks BANK1 and BANK2 can be simultaneously accessed for multi-bit data access operations.

In one particular embodiment of memories 600 and 650, the sense amplifiers consume a current of 150 $\mu$A when a word line in a sub-array containing $(2^M+2^M/2)$ memory cells per bit line is activated. Related sense amplifiers consume a current of 100 $\mu$A when a word line in a sub-array containing $(2^M+2^M/4)$ memory cells per bit line is activated. In FIG. 6A, when two word lines, one in each of sub-arrays 401 and 407 (containing $(2^M+2^M/2)$ memory cells per bit line), are simultaneously activated, sense amplifiers consume a total current of 300 $\mu$A (150*2). When two word lines, one in each of sub-arrays 402 and 408 (containing $(2^M+2^M/4)$ memory cells per bit line), are simultaneously activated, the related sense amplifiers consume 200 $\mu$A (100*2). Therefore, in memory 600 the sense amplifiers a maximum current of 300 $\mu$A when the two word lines are simultaneously activated.

In contrast, using the same sense amplifiers in memory 650, when two word lines, one in each of sub-arrays 413 and 419 in the respective banks BANK1 and BANK2, are simultaneously activated, the related sense amplifiers consume 250 $\mu$A(150+100). When two word lines, one in each of sub-arrays 414 and 420 (each having $(2^M+2^M/4)$ memory cells per bit line), are simultaneously activated, the related sense amplifiers consume 200 $\mu$A (100*2). Therefore, memory 650 consumes a maximum current of 250 $\mu$A when two word lines are simultaneously activated.

The invention has been described using exemplary embodiments. However, the scope of the invention is not limited to the disclosed embodiments. To the contrary, embodiments of the invention include various modifications and similar arrangements. The scope of the claims, therefore, should be accorded the broadest interpretation so as to encompass all such modifications and arrangements.

What is claimed is:

1. A semiconductor memory device comprising a memory cell array that includes a plurality of sub-arrays, wherein:

each of the sub-arrays comprises a plurality of word lines, a plurality of bit lines and a plurality of memory cells arranged at intersections of the word lines and the bit lines; and a number of memory cells coupled to the bit lines of a first of the sub-arrays differs from a number of memory cells coupled to the bit lines of a second of the sub-arrays.

2. The semiconductor memory device according to claim 1, further comprising sense amplifier regions between adjacent sub-arrays.

3. The semiconductor memory device according to claim 1, wherein the number of memory cells coupled to the respective bit lines in each of the second sub-arrays is $(2^M+2^M/N)$ where M is an integer and N is an integer multiple of 2.

4. The semiconductor memory device according to claim 1, wherein the number of memory cells coupled to the bit lines in the first sub-array is a power of 2.

5. The semiconductor memory device according to claim 1, wherein the numbers of the memory cells coupled to the bit lines of the sub-arrays are of the form $(2^M+2^M/N)$ where M is an integer and N is a multiple of two depending on the sub-array.

6. A semiconductor memory device comprising a first set of one or more sub-arrays and a second set of one or more sub-arrays, wherein:

each of the sub-arrays in the first and second sets comprises a plurality of word lines, a plurality of bit lines, and a plurality of memory cells arranged at intersections of the word lines and the bit lines;

a number of memory cells coupled to the bit lines in each sub-array in the first set differs from a number of memory cells coupled to the bit lines in each sub-array in the second set; and an access of the sub-arrays simultaneously accesses one sub-array from the first set and one sub-array from the second set, and thereby reduces maximum current when compared to accessing two sub-arrays from the second set.

7. The semiconductor memory device according to claim 6, wherein the number of memory cells coupled to the respective bit lines in each of the sub-arrays in the second set is $(2^M+2^M/N)$ where M is an integer and N is an integer multiple of 2.

8. The semiconductor memory device according to claim 6, wherein the number of memory cells coupled to the respective bit lines in each of the sub-arrays in the first set is a power of 2.

* * * * *